(12) United States Patent
Yamaji

(10) Patent No.: US 11,373,997 B2
(45) Date of Patent: Jun. 28, 2022

(54) HIGH VOLTAGE INTEGRATED CIRCUIT DEVICE EMPLOYING ELEMENT SEPARATION METHOD USING HIGH VOLTAGE JUNCTION

(71) Applicant: FUJI ELECTRIC CO., LTD., Kawasaki (JP)

(72) Inventor: Masaharu Yamaji, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 279 days.

(21) Appl. No.: 15/581,068

(22) Filed: Apr. 28, 2017

(65) Prior Publication Data

US 2017/0365598 A1 Dec. 21, 2017

(30) Foreign Application Priority Data

Jun. 15, 2016 (JP) .............................. JP2016-119379

(51) Int. Cl.
*H01L 27/02* (2006.01)
*H01L 27/07* (2006.01)
(Continued)

(52) U.S. Cl.
CPC ........ *H01L 27/0288* (2013.01); *H01L 21/761* (2013.01); *H01L 27/0248* (2013.01);
(Continued)

(58) Field of Classification Search
CPC ............... H01L 21/761; H01L 27/0288; H01L 27/0292; H01L 27/0296
(Continued)

(56) References Cited

U.S. PATENT DOCUMENTS

2005/0144539 A1 6/2005 Orita
2005/0179089 A1* 8/2005 Shimizu ............... H01L 21/761
257/358
(Continued)

FOREIGN PATENT DOCUMENTS

JP H07-337070 A 12/1995
JP 2005-176174 A 6/2005
(Continued)

*Primary Examiner* — Xia L Cross
(74) *Attorney, Agent, or Firm* — Rabin & Berdo, P.C.

(57) ABSTRACT

An HVIC is a gate driver IC that drives a three-phase inverter and includes high-potential-side regions for three phases on a single semiconductor substrate. The high-potential-side region includes an n-type region and has a potential that is fixed at a power source voltage potential through a VB contact region in the n-type region. The high-potential-side region has a high-side driving circuit that drives an upper arm element of the inverter. An interphase region between adjacent high-potential-side regions has no GND contact region and no GND contact electrode arranged therein, and has only a p-type region at a ground potential constituting a low-potential-side region. The high-potential-side region of one phase has a p$^-$-type opening between the high-side driving circuit of thereof and the high-side driving circuit or the GND contact region of an adjacent high-potential-side region that is of another phase and sandwiches the interphase region therebetween.

14 Claims, 14 Drawing Sheets

(51) Int. Cl.
    *H01L 29/06*     (2006.01)
    *H01L 21/761*    (2006.01)
    *H01L 29/78*     (2006.01)

(52) U.S. Cl.
    CPC ...... *H01L 27/0292* (2013.01); *H01L 27/0296* (2013.01); *H01L 27/0727* (2013.01); *H01L 29/0638* (2013.01); *H01L 29/7835* (2013.01)

(58) Field of Classification Search
    USPC .......................................................... 257/500
    See application file for complete search history.

(56) References Cited

U.S. PATENT DOCUMENTS

| | | | |
|---|---|---|---|
| 2010/0283116 A1 | 11/2010 | Shimizu | |
| 2015/0023082 A1* | 1/2015 | Yamaji | H01L 27/0814 |
| | | | 363/131 |
| 2015/0236013 A1 | 8/2015 | Yamaji | |
| 2016/0308534 A1 | 10/2016 | Yamaji | |

FOREIGN PATENT DOCUMENTS

| | | |
|---|---|---|
| JP | 2010-263116 A | 11/2010 |
| JP | 2015-173255 A | 10/2015 |
| JP | 5825443 B2 | 12/2015 |
| WO | WO-2016/002508 A1 | 1/2016 |

\* cited by examiner

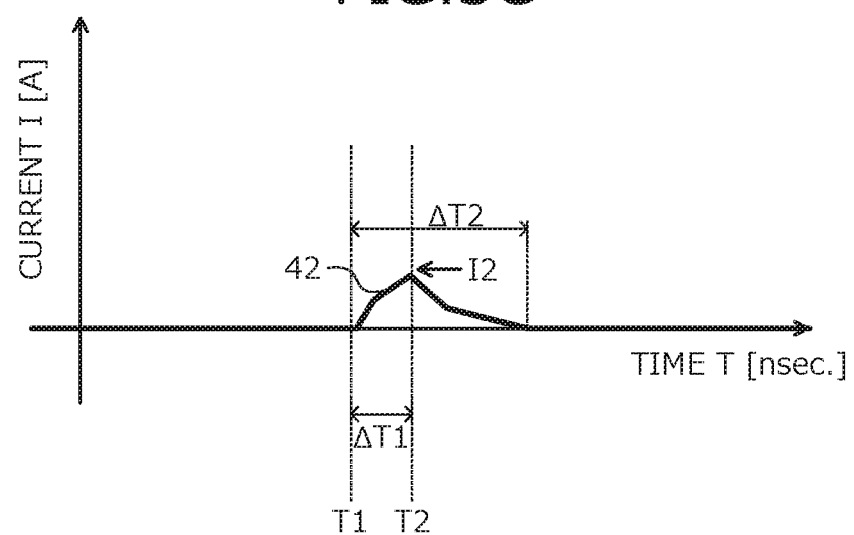

HIGH VOLTAGE INTEGRATED CIRCUIT DEVICE EMPLOYING ELEMENT SEPARATION METHOD USING HIGH VOLTAGE JUNCTION

CROSS REFERENCE TO RELATED APPLICATIONS

This application is based upon and claims the benefit of priority of the prior Japanese Patent Application No. 2016-119379, filed on Jun. 15, 2016, the entire contents of which are incorporated herein by reference.

BACKGROUND OF THE INVENTION

1. Field of the Invention

Embodiments of the invention relate to a semiconductor integrated circuit device.

2. Description of the Related Art

High voltage integrated circuit (HVIC) devices are conventionally grouped into, for example, gate driver ICs having a high-side gate driver and a low-side gate driver of a power device incorporated therein, ICs having a heat protection function and an overcurrent protection function, and inverter ICs having a control circuit and a power device integrated on a single semiconductor substrate (one chip). The HVIC significantly contributes to size reductions and improved efficiency as an overall inverter system consequent to a reduced number of parts implemented on a mount substrate.

In a HVIC according to a known element separation method using a high voltage junction, a high-potential side (a high-side side) region and a low-potential side (a low-side side) region provided on a single semiconductor substrate are electrically separated by a high voltage junction termination (HVJT) region that is provided between the regions. For example, when an HVIC employing the element separation method using a high voltage junction by the HVJT is used as a gate driver IC that drives a three-phase inverter, the high-side driving circuits for the phases are arranged in different high-potential-side regions that are separated from each other by the HVJT. Configurations of the three-phase inverter and the HVIC driving the three-phase inverter will be described.

FIG. 7 is a circuit diagram of a circuit configuration of an ordinary three-phase inverter. As depicted in FIG. 7, the three-phase inverter 200 includes half-bridge circuits 201 to 203 for the three phases (a U-phase, a V-phase, and a W-phase). A load 205 such as a motor is connected to output points (intermediate points) 204 of the half-bridge circuits 201 to 203. The half-bridge circuits 201 to 203 each includes a switching element 206 on a high-potential side (an upper arm) and a switching element 207 on a low-potential side (a lower arm) that are connected in series, and are connected in parallel between a high-potential side line 208 of a power source voltage Vcc and a low potential line 209 of a ground voltage GND of the three-phase inverter 200.

The switching elements 206 and 207 are each, for example, an insulated gate bipolar transistor (IGBT) and each has a free wheeling diode (FWD) connected in parallel thereto. The connection point of the upper arm switching element 206 and the lower arm switching element 207 is the output point 204 of each of the half-bridge circuits 201 to 203, and is connected to a VS terminal of the HVIC 210. The HVIC 210 is a gate driver IC that drives the three-phase inverter 200. The potential of the VS terminal of the HVIC 210 varies between the power source voltage Vcc and the ground voltage GND of the three-phase inverter 200.

FIG. 8 is a block diagram of a circuit configuration of an ordinary HVIC. FIG. 8 depicts the U-phase half-bridge circuit 201 and a driving circuit unit of the U-phase half-bridge circuit 201, of the half-bridge circuits 201 to 203 constituting the three-phase inverter 200 of FIG. 7. The HVIC 210 includes the driving circuit unit of quantity corresponding to the three phases, each driving circuit unit including an input signal processing circuit 211, a high-side driving circuit 212, and a low-side driving circuit 213 as one set. The input signal processing circuit 211 receives input signals from input terminals IN1 and IN2, and outputs ON/OFF signals to the high-side driving circuit 212 and the low-side driving circuit 213.

The high-side driving circuit 212 is a gate driving circuit that drives the upper arm switching element 206. The low-side driving circuit 213 is a gate driving circuit that drives the lower arm switching element 207. The high-side driving circuit 212 and the low-side driving circuit 213 each includes a driver circuit 216, and other circuit units 215 such as a logic circuit, a low-pass filter, and an RS latch. The high-side driving circuit 212 includes a level shift circuit 214. The switching element 206 receives inputs of ON/OFF signals from the input terminal IN1, and is turned on or off by a gate signal input thereinto through the input signal processing circuit 211, the level shift circuit 214, the other circuit units 215 such as the logic circuit, the low-pass filter, and the RS latch, and the driver circuit 216.

FIGS. 9 and 10 are each a plan diagram of a planar layout of a conventional HVIC. The HVIC 210 includes high-potential-side regions 221, a low-potential-side region 222, and an HVJT (not depicted) on a single semiconductor substrate 230. The plural high-potential-side regions 221 are arranged away from each other, and each of the high-potential-side regions 221 has the high-side driving circuit 212 for one phase arranged therein. In FIGS. 9 and 10, the high-potential-side regions 221 in which the high-side driving circuits 212 of the U-phase, the V-phase, and the W-phase are arranged (hereinafter, referred to as high-potential-side regions of the U-phase, the V-phase, and the W-phase), are denoted by U, V, and W. FIGS. 9 and 10 respectively depict cases where the high-potential-side regions 221 are arranged in a matrix and in stripes.

High voltage n-channel metal oxide semiconductor field effect transistors ((MOSFETs) hereinafter, each referred to as "HVNMOS") 214a and 214b constituting the level shift circuits 214 for setting (set) and resetting (reset) of the high-side driving circuit 212 are arranged at a portion of each of the high-potential-side regions 221, facing an interphase region 223. A reference numeral "215a" denotes the RS latch that is included in the circuit units 215 of the high-side driving circuit 212.

Although not depicted, the driver circuit 216 and the circuit units 215 exclusive of the RS latch 215a are also arranged in a predetermined planar layout in the high-potential-side region 221. The portion of the semiconductor substrate 230 excluding the high-potential-side regions 221 is the low-potential-side region 222. In the low-potential-side region 222, the input signal processing circuit 211 and the low-side driving circuit 213 are arranged away from each other. The interphase region 223 is a portion of the low-potential-side region 222 between the high-potential-side regions 221, or a portion sandwiched by the high-potential-side region 221 and the circuit units (the input signal processing circuit 211 and the low-side driving circuit 213) of the low-potential-side region 222.

In a case where the HVIC 210 drives the half-bridge circuits 201 to 203, when switching of each of the half-bridge circuits 201 to 203 is executed, the following problem arises due to the effect of the parasitic inductance component generated by the load 200, wiring on the printed circuit board, and the like. When the upper arm switching element 206 transitions from an ON state to an OFF state, the potential of the output points 204 of the half-bridge circuits 201 to 203, that is, the VS terminal of the HVIC 210 transitionally undershoots at a negative voltage relative to the potential of the ground voltage GND.

A device that is formed by inserting a clamping high voltage diode between a VS terminal and a GND terminal at the ground voltage potential has been proposed as an HVIC for which malfunction caused by a negative voltage surge applied to the VS terminal is prevented (see, for example, Japanese Laid-Open Patent Publication No. 2010-263116). In Japanese Laid-Open Patent Publication No. 2010-263116, when the potential of the VS terminal of the HVIC becomes a negative potential, the clamping high voltage diode is turned on and the voltage level of the VS terminal is clamped (limited to) at a voltage level that is lower than the ground voltage by an amount corresponding to a forward voltage drop of the clamping high voltage diode to thereby reduce the undershooting at the VS terminal.

A circuit device whose level shift circuit is connected in parallel to a malfunction detecting circuit, which is a dummy switching element fixed in the OFF state as an ordinary use condition has been proposed as another HVIC for which malfunction caused by a negative voltage surge applied to the VS terminal is prevented (see, for example, Japanese Laid-Open Patent Publication No. 2005-176174). In Japanese Laid-Open Patent Publication No. 2005-176174, the configurations of a false signal detecting resistor and a malfunction detecting circuit are set to be same as those of a level shift resistor and a level shift circuit, and a voltage drop of the false signal detecting resistor is used as a false signal generating signal that indicates generation of a false signal in the level shift circuit to thereby execute predetermined processing to prevent malfunction.

A device that has no level shift circuit arranged in the interphase regions between the high-potential-side regions and that has a level shift circuit at a position equally away from adjacent high-potential-side regions has been proposed as another HVIC for which malfunction caused by a negative voltage surge is prevented (see, for example, Japanese Patent No. 5825443). In Japanese Patent No. 5825443, when a negative voltage surge is input into the VS terminal of the HVIC, the flow of electron carriers that flow from one high-potential-side region of one phase into another high-potential-side region of another phase adjacent to the one high-potential-side region is reduced.

FIGS. 11 and 12 are each a plan diagram of another example of the planar layout of the conventional HVIC. FIGS. 11 and 12 are FIGS. 6 and 1 of Japanese Patent No. 5825443. When the high-potential-side regions 221 are arranged in a matrix planar layout, the HVNMOSs 214a and 214b are arranged in portions of the high-potential-side regions 221, corresponding to two sides not facing the interphase region 223, each of the portions having a substantially rectangular planar shape (FIG. 11). Similarly, when the high-potential-side regions 221 are each arranged in a stripe-like planar layout, the HVNMOSs 214a and 214b are arranged in portions of the high-potential-side regions 221, corresponding to the ends not facing the interphase region 223, each of the portions having a straight linear shape (FIG. 12).

In a device proposed as a circuit device that suppresses surge generated by an inductive load, a trapezoidal wave having a moderate rise and a moderate fall is input into the gate of each of the transistors that constitute a three-phase inverter using charging and discharging produced by switching among plural current sources (see, for example, Japanese Laid-Open Patent Publication No. H7-337070). In Japanese Laid-Open Patent Publication No. H7-337070, plural current sources and plural switches are provided in each of the transistors constituting the three-phase inverter and each of the transistors adjusts the voltage waveforms of the rise and the fall for the gate thereof.

As yet another HVIC for which malfunction caused by a negative voltage surge is prevented, a device has been proposed whose n-type well region that is an edge termination region surrounding the high-potential-side regions has a $p^-$-type opening provided therein to be a missing portion that penetrates the p-type well region in the depth direction and reaches a p-type region on the side of the rear surface of the substrate, from the front surface of the substrate, (see, for example, Japanese Laid-Open Patent Publication No. 2015-173255 and International Publication No. 2016/002508). In Japanese Laid-Open Patent Publication No. 2015-173255 and International Publication No. 2016/002508, when a negative voltage surge is input into the VS terminal, no hole carrier is caused to flow into any region at the VS potential by setting the $p^-$-type opening to be a potential barrier.

SUMMARY OF THE INVENTION

According to one aspect of the present invention, a semiconductor integrated circuit device includes a first semiconductor region of a first conductivity type, selectively provided in a surface layer of a semiconductor substrate; a second semiconductor region of a second conductivity type, selectively provided in the first semiconductor region; a third semiconductor region of the second conductivity type, formed from a portion of the surface layer of the semiconductor substrate, excluding the first semiconductor region; a first electrode at a maximum potential of a power source voltage, the first electrode contacting the first semiconductor region; a second electrode contacting the second semiconductor region; and a third electrode at a minimum potential of the power source voltage, the third electrode contacting the third semiconductor region. Plural high-potential-side regions are arranged, each including: the first semiconductor region, the second semiconductor region, the first electrode, and the second electrode. The third electrode contacts a portion of the third semiconductor region, excluding an interphase region between adjacent high-potential-side regions among the plurality of high-potential-side regions. The interphase region is constituted by only the third semiconductor region.

The semiconductor integrated circuit device includes a fourth semiconductor region of the second conductivity type, selectively provided in the first semiconductor region to penetrate the first semiconductor region in a depth direction. The first electrode contacts a fifth semiconductor region located in the first semiconductor region. The fifth semiconductor region has a relatively high impurity concentration. The fourth semiconductor region in a first high-potential-side region among the plurality of high-potential-side regions is arranged between the interphase region and the fifth semiconductor region in the first high-potential-side region.

The semiconductor integrated circuit device includes one or more circuit units arranged in a second high-potential-side region of the plurality of high-potential-side regions. The one or more circuit units each uses a potential of the second electrode as a reference potential thereof. The one or more circuit units each operates at the maximum potential of the power source voltage. The fourth semiconductor region in the first high-potential-side region is arranged between the fifth semiconductor region in the first high-potential-side region and the one or more circuit units arranged in the second high-potential-side region that is adjacent to the first high-potential-side region and sandwiches the interphase region therebetween.

The semiconductor integrated circuit device includes a fourth semiconductor region of the second conductivity type, selectively provided in the first semiconductor region to penetrate the first semiconductor region in a depth direction; and one or more circuit units arranged in the first semiconductor region. The one or more circuit units each uses a potential of the second electrode as a reference potential thereof. The one or more circuit units each operates using a potential of the power source voltage as a maximum potential thereof. The fourth semiconductor region in a first high-potential-side region among the plural high-potential-side regions is arranged between the interphase region and the one or more circuit units arranged in the first high-potential-side region.

In the semiconductor integrated circuit device, the fourth semiconductor region in the first high-potential-side region is arranged between the one or more circuit units arranged in the first high-potential-side region and the one or more circuit units arranged in a second high-potential-side region that is adjacent to the first high-potential-side region and sandwiches the interphase region therebetween. The second high-potential-side region is among the plural high-potential-side regions.

In the semiconductor integrated circuit device, the one or more circuit units are each a logic circuit retaining 1-bit information.

Objects, features, and advantages of the present invention are specifically set forth in or will become apparent from the following detailed description of the invention when read in conjunction with the accompanying drawings.

BRIEF DESCRIPTION OF THE DRAWINGS

FIGS. 3A, 3B, and 3C are timing charts of the relationship between negative voltage surge and the amount of electron carriers that flow in;

DETAILED DESCRIPTION OF THE INVENTION

Figure 1:
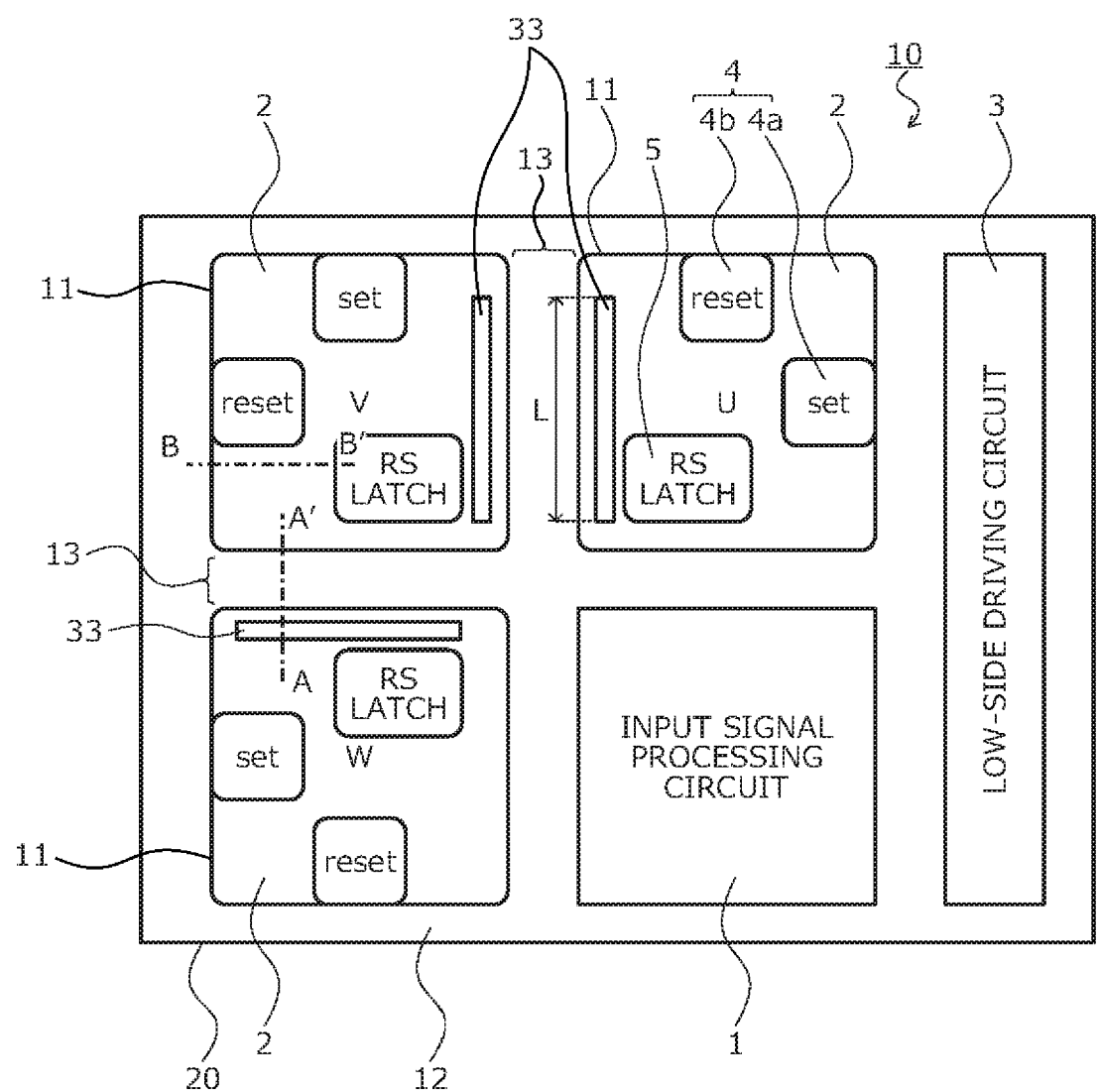
FIG. 1 is a plan diagram of a planar layout of a semiconductor integrated circuit device according to a first embodiment.

Embodiments of a semiconductor integrated circuit device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 7:
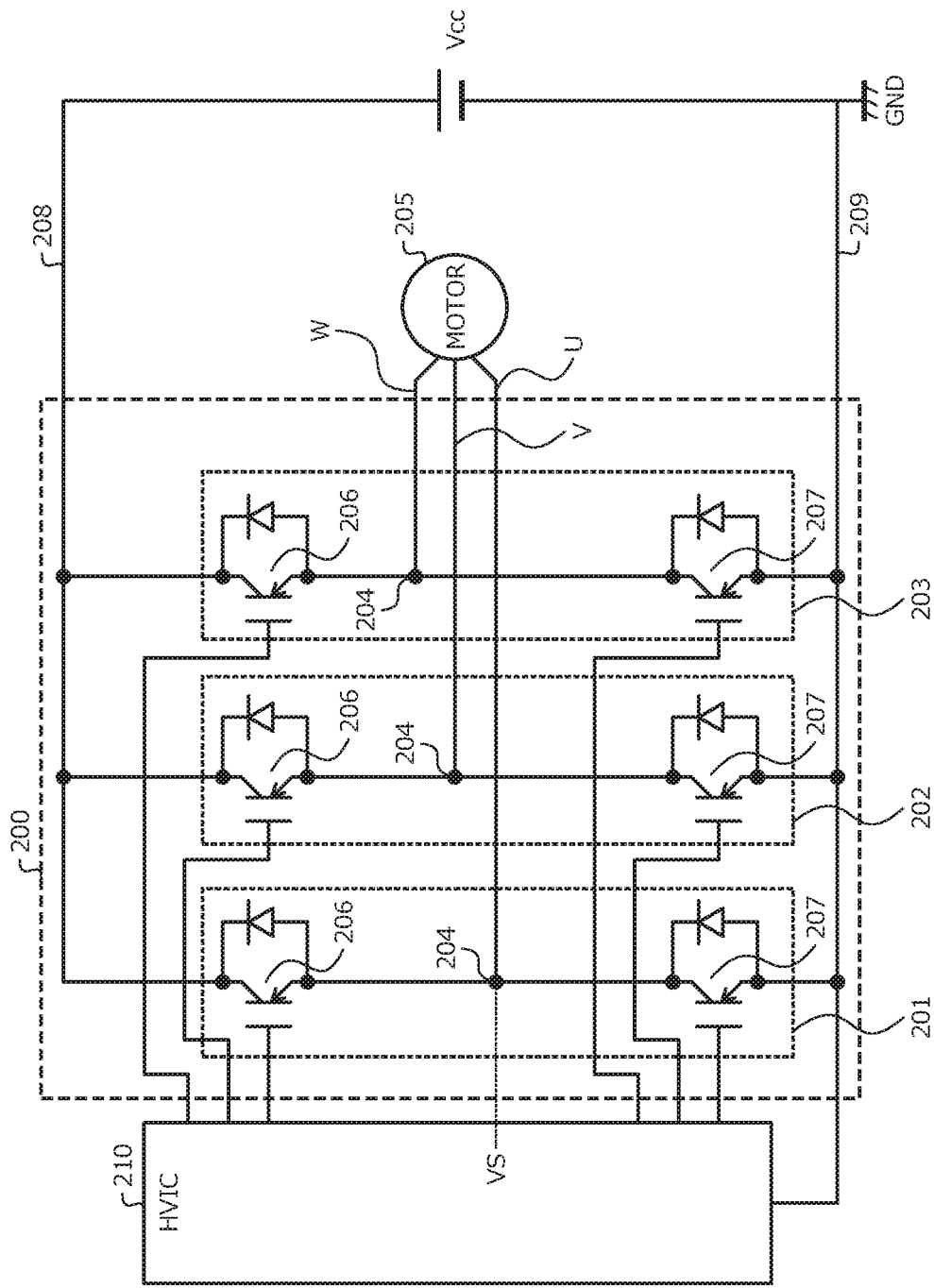
FIG. 7 is a circuit diagram of a circuit configuration of an ordinary three-phase inverter.
Figure 8:
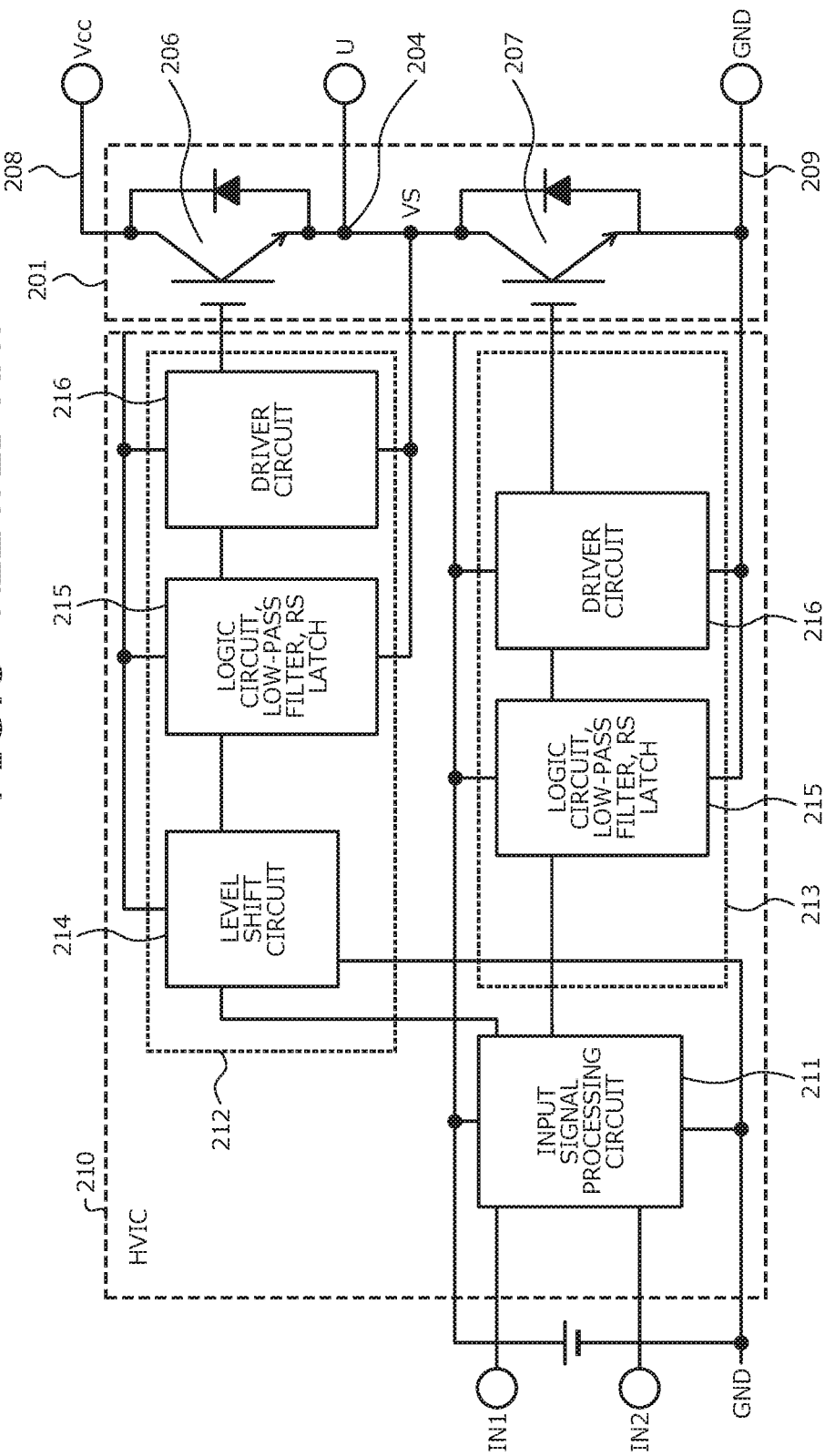
FIG. 8 is a block diagram of a circuit configuration of an ordinary HVIC.

A structure of a semiconductor integrated circuit device according to a first embodiment will be described with reference to FIGS. 1, 7, and 8. FIG. 1 is a plan diagram of a planar layout of the semiconductor integrated circuit device according to the first embodiment. The semiconductor integrated circuit device according to the first embodiment depicted in FIG. 1 is a high voltage integrated circuit device (HVIC) 10 to be a gate driver IC that drives half-bridge circuits 201 to 203 for three phases (a U-phase, a V-phase, and a W-phase) of a three-phase inverter 200. The configuration of the three-phase inverter 200 is same as that formed by replacing a reference numeral "210" in FIG. 7 with a reference numeral "10", and will not again be described.

The HVIC 10 includes driving circuit units of a quantity corresponding to the three phases, each driving circuit unit including an input signal processing circuit 1, high-side driving circuits 2, and a low-side driving circuit 3 as one set to drive a half-bridge circuit for one phase. The circuit configuration of the HVIC 10 is same as that formed by replacing reference numerals "210" to "214" in FIG. 8 respectively with reference numerals "10" and "1" to "4". The input signal processing circuit 1 receives input signals from input terminals IN1 and IN2 and outputs ON/OFF signals to the high-side driving circuits 2 and the low-side driving circuit 3.

The high-side driving circuits 2 operate using the potential of the VS terminal of the HVIC 10 as a reference potential and the potential of a power source voltage VB as a maximum potential, and drives an upper arm switching element 206 of the half-bridge circuit. The low-side driving circuit 3 operates using a potential lower than the power source voltage VB of the high-side driving circuit 2 as a power source potential and the minimum potential of the HVIC 10 (the potential of the ground voltage GND) as a reference potential, and drives a lower arm switching element 207 of the half-bridge circuit.

The high-side driving circuit 2 and the low-side driving circuit 3 each includes a level shift circuit 4, a driver circuit 216, and other circuit units 215 such as a logic circuit, a low-pass filter, and an RS latch 5. The switching elements 206 and 207 are each turned on or off by a gate signal input through the input signal processing circuit 1, the level shift circuit 4, the logic circuit, the low-pass filter, the RS latch 5, and the driver circuit 216 when the input signal processing circuit 211 receives an input of an ON/OFF signal from each of the input terminals IN1 and IN2.

For example, the HVIC 10 includes high-potential-side regions 11, low-potential-side regions 12, and the HVJTs (not depicted) on a single semiconductor substrate 20 of a quantity corresponding to the three phases (i.e., three). The high-potential-side regions 11 are arranged away from each other in, for example, a matrix planar layout. The high-potential-side regions 11 are electrically connected to a contact electrode at the power source voltage VB (hereinafter, referred to as "VB contact electrode") through an $n^+$-type contact region (hereinafter, referred to as "VB contact region") not depicted, and have a potential that is fixed at the potential of the power source voltage VB.

Each of the high-potential-side regions 11 has the high-side driving circuit 2 for one phase arranged therein. In FIG. 1, the high-potential-side regions 11, each having the high-side driving circuit 2 for one of the phases (the U-phase, the V-phase, and the W-phase) arranged therein, are denoted by U, V, and W (similarly in FIGS. 4 and 5). HVNMOSs 4a and 4b constituting the level shift circuits 4 for setting (set) and resetting (reset) of the high-side driving circuit 2 are arranged in a portion of the high-potential-side regions 11, corresponding to two sides not facing an interphase region 13, each of the portions having, for example, a substantially rectangular planar shape.

The interphase region 13 is a portion of a low-potential-side region 12, between the high-potential-side regions 11. The low-potential-side region 12 is a portion exclusive of the high-potential-side regions 11 of the semiconductor substrate 20. The low-potential-side region 12 has the input signal processing circuit 1 and the low-side driving circuit 3 arranged therein away from each other. The low-potential-side region 12 is electrically connected to a contact electrode at a ground voltage GND (hereinafter, referred to as "GND contact electrode") through a $p^+$-type contact region (hereinafter, referred to as "GND contact region") not depicted, and has a potential that is fixed at the potential of the ground voltage GND. The GND contact electrode 35 is an example of a third electrode.

The flow of electron carriers into the drain terminals of the HVNMOSs 4a and 4b arranged in the high-potential-side region 11 of one phase (for example, the U-phase), from the high-potential-side region 11 of another phase (for example, the V-phase) adjacent to the high-potential-side region 11 of the one phase (U-phase) may be suppressed by arranging the HVNMOSs 4a and 4b so as not to face the interphase region 13. Thus, the amounts of the electron carriers flowing into the HVNMOSs 4a and 4b of the high-potential-side region 11 of the one phase (U-phase) may be equalized whereby malfunction of the HVNMOSs 4a and 4b may be prevented.

The interphase region 13 does not have the GND contact region or the GND contact electrode arranged therein. When a negative voltage surge is applied to a contact electrode of the high-potential-side region 11 of one phase (for example, the U-phase), the contact electrode being at the VS terminal potential (see FIGS. 7 and 8) of the HVIC 10 (hereinafter, referred to as "VS contact electrode"), the amount of the hole carriers that flow from the interphase region 13 into the high-potential-side region 11 of the one phase (U-phase) may be reduced. Thus, the amount of the electron carriers that flow from the high-potential-side region 11 of the one phase (U-phase) into the high-potential-side region 11 of another phase (for example, the V-phase) may be reduced.

A $p^-$-type opening 33 may be provided inside the high-potential-side region 11. The $p^-$-type opening 33 is a $p^-$-type region that is arranged in a planar layout to form an opening in a portion of an n-type region 21 or an $n^-$-type region 22 (see FIG. 2A) described later that constitutes the high-potential-side region 11. The n-type region 21 and $n^-$-type region 22 are an example of a first semiconductor region. The $p^-$-type opening 33 is an example of a fourth semiconductor region. The $p^-$-type opening 33 is arranged between at least one circuit unit (at least the RS latch 5) to be protected in the high-potential-side region 11 of one phase and a circuit unit or the VB contact region in the high-potential-side region 11 of another phase adjacent to the circuit unit(s) to be protected and sandwiching the interphase region 13 therebetween. In this case, the $p^-$-type opening 33 has a function of suppressing the amount of the electron carriers flowing from the high-potential-side region 11 of the other phase into the high-potential-side region 11 of the one phase and thereby, prevents malfunction of the protected circuit units of the high-potential-side region 11 of the one phase.

When the VB contact region is arranged to be closer to the interphase region 13 than the circuit units to be protected in the high-potential-side region 11 of the one phase are, the $p^-$-type opening 33 is arranged farther on the interphase region 13 side than the VB contact region of the high-potential-side region 11 of the one phase. The $p^-$-type opening 33 is also arranged between the VB contact region in the high-potential-side region 11 of the one phase and circuit units to be protected in the high-potential-side region 11 of the other phase adjacent to the VB contact region and sandwiching the interphase region 13 therebetween. In this case, the $p^-$-type opening 33 further has a function of suppressing the amount of the electron carriers flowing in from the high-potential-side region 11 of the one phase into the high-potential-side region 11 of the other phase and thereby prevents malfunction of the protected circuit units of the high-potential-side region 11 of the other phase.

FIG. 1 depicts a state where the $p^-$-type opening 33 is arranged in the high-potential-side region 11 of the W-phase to be sandwiched between the RS latches 5 in the high-potential-side regions 11 of the U-phase and the W-phase. FIG. 1 also depicts a state where the $p^-$-type opening 33 is arranged in each of the high-potential-side regions 11 of the U-phase and the V-phase to be sandwiched between the RS latches 5 in the respective high-potential-side regions 11 of these phases. In this example, the $p^-$-type openings 33 in the high-potential-side regions 11 of the U-phase and the V-phase face each other sandwiching the interphase region 13 therebetween, however, the flow of the electron carriers in both directions between the high-potential-side regions 11 of the U-phase and the V-phase may be suppressed when only one of the $p^-$-type openings 33 in the high-potential-side regions 11 of these phases is arranged.

As described above, in the example depicted in FIG. 1, although only one of the $p^-$-type openings 33 in the high-potential-side regions 11 of the U-phase and the V-phase may be arranged, preferably, the planar layouts of the circuit units and the $p^-$-type openings 33 may be uniform among all the high-potential-side regions 11 as depicted in FIG. 1. The reason for this is that the properties of all the high-side driving circuits 2 may be substantially equalized, thereby, facilitating the design of the HVIC 10. The high-potential-side regions 11 may be arranged to be oriented so that the arrangement of the circuit units and the p⁻-type openings 33 of the high-potential-side regions 11 are linearly symmetric or point-symmetric.

The p⁻-type opening 33 is arranged, for example, along one side of the high-potential-side region 11 in a planar layout of a linear-shape having a length L so as not to exit the high-potential-side region 11. The p⁻-type opening 33 may be arranged along one side of the high-potential-side region 11 in a planar layout of a linear-shape having a length L so as to exit the high-potential-side region 11 (not depicted). In this case, to secure the breakdown voltage of the interphase region 13, the impurity concentration of the p⁻-type opening 33 is set to be an impurity concentration by which the p⁻-type opening 33 is completely depleted when a negative voltage surge is produced in the VS contact electrode of the high-potential-side region 11 of the one phase.

Figure 2A:
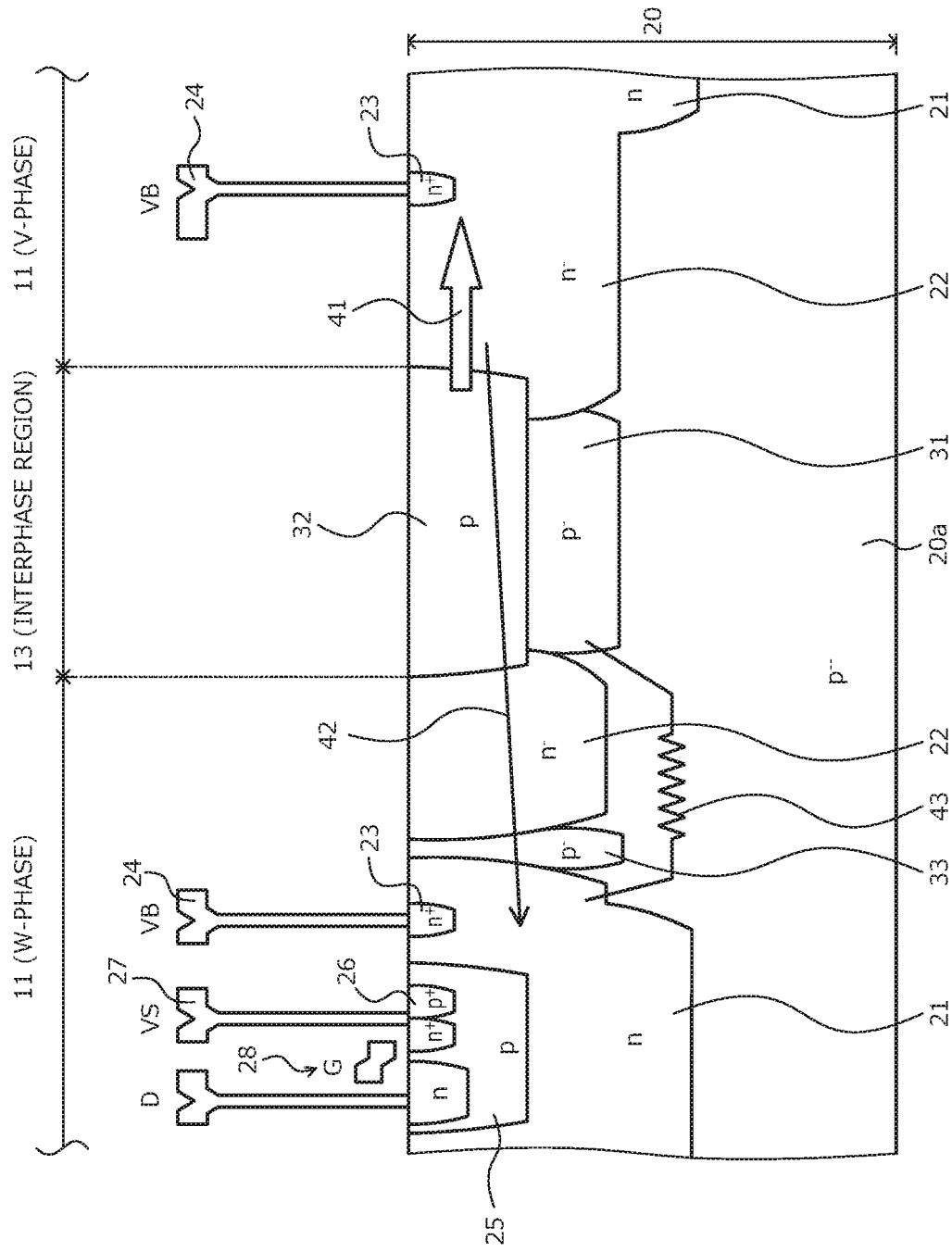
FIG. 2A is a cross-sectional view of an example of a structure of an interphase region of the semiconductor integrated circuit device according to the first embodiment taken along a cutting line A-A' in FIG. 1.

A cross-sectional structure of the interphase region 13 of the semiconductor integrated circuit device according to the first embodiment will be described. FIG. 2A is a cross-sectional view of an example of the structure of the interphase region of the semiconductor integrated circuit device according to the first embodiment taken along a cutting line A-A' in FIG. 1. FIG. 2A also depicts a case where the VB contact region 23 is arranged to be closer to the interphase region 13 than the circuit units to be protected in the high-potential-side region 11 of the one phase are. The VB contact region 23 is an example of a fourth semiconductor region. As depicted in FIG. 2A, the n-type region 21 is selectively provided in the surface layer of a front surface of the p⁻⁻⁻-type semiconductor substrate 20. The n⁻-type region 22 surrounds a periphery of the n-type region 21. The depth of the n⁻-type region 22 may, for example, be shallower than the depth of the n⁻-type region 21.

The n-type regions including the n-type region 21 and the n⁻-type region 22 surrounding the periphery thereof, as one set, constitute the high-potential-side region 11 for one phase. The circuit units constituting the high-side driving circuit 2 (see FIG. 8) are arranged in the n-type region 21 and the n⁻-type region 22. The VB contact region (n⁺-type contact region) 23 is selectively provided in the n-type region 21 or the n⁻-type region 22. The n-type region 21 or the n⁻-type region 22 is electrically connected to the VB contact electrode 24 through the VB contact region 23 and has a potential that is fixed at the potential of the power source voltage VB. The VB contact electrode 24 is an example of a first electrode.

A p-type well region 25 is selectively provided in the n-type region 21. The p-type well region 25 is an example of a second semiconductor region. A p⁺-type contact region (hereinafter, referred to as "VS contact region") 26 is selectively provided in the p-type well region 25. The p-type well region 25 is electrically connected to a contact electrode (VS contact electrode) 27 via the VS contact region 26 and has a potential that is fixed at the potential of the VS terminal of the HVIC 10. The VS contact electrode 27 is an example of a second electrode. For example, a horizontal NMOS 28 constituting the high-side driving circuit 2 is arranged in the p-type well region 25. The VS contact region 26 and the VS contact electrode 27 also act respectively as a p⁺-type contact region and a source electrode of the horizontal NMOS 28.

A portion of a surface region on the front surface of the semiconductor substrate 20, excluding the n-type region 21 and the n⁻-type region 22, is the low-potential-side region 12. The low-potential-side region 12 has a p⁻-type region 31 provided in the surface layer of the front surface of the semiconductor substrate 20. The p⁻-type region 31 is an example of a third semiconductor region. To secure the breakdown voltage of the low-potential-side region 12, preferably, the impurity concentration of the p⁻-type region 31 may set to be higher than the impurity concentration of the n⁻-type region 22. A surface region of the p⁻-type region 31 has a p-type region 32 provided therein.

Figure 2B:
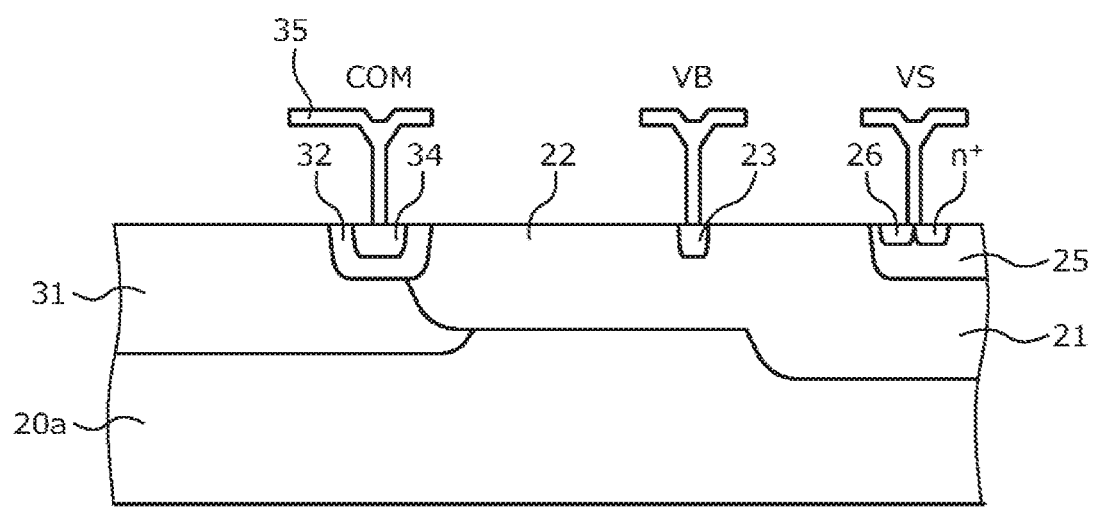
FIG. 2B is a cross-sectional view according to the first embodiment taken along a cutting line B-B' in FIG. 1.

FIG. 2B is a cross-sectional view according to the first embodiment taken along a cutting line B-B' in FIG. 1. The p-type region 32 is electrically connected to the GND contact electrode 35 via the GND contact region 34 in a portion, and has a potential that is fixed at the potential of the ground voltage GND. The p⁻-type region 31 and the p-type region 32 have a function of fixing the potential of the semiconductor substrate 20 on the front surface side of the semiconductor substrate 20 at the potential of the ground voltage GND and suppressing fluctuation of the potential of the ground voltage GND. The p⁻-type region 31 may be provided alone without providing the p-type region 32. In this case, in the interphase region 13 as well, only the p⁻-type region 31 having high resistance is provided whereby the amount of the hole carriers flowing into the high-potential-side region 11 may be further suppressed.

A region of the low-potential-side region 12 between the adjacent n⁻-type regions 22 is the interphase region 13. The interphase region 13 does not have the GND contact region or the GND contact electrode arranged therein, the GND contact region 34 and the GND contact electrode 35 being sources of the hole carriers flowing into the high-potential-side region 11 of one phase when a negative voltage surge is produced in the VS contact electrode 27 of the high-potential-side region 11. Therefore, the amount of the hole carriers that flow from the p-type region 31 and the p-type region 32 toward the VB contact region 23 in the high-potential-side region 11 of the one phase are reduced. The reduction of the amount of the hole carriers flowing into the high-potential-side region 11 of the one phase causes the amount of the electron carriers that flow from the high-potential-side region 11 of the one phase into the high-potential-side region 11 of another phase to also be reduced.

The p⁻-type opening 33 penetrates the n-type region 21 or the n⁻-type region 22 in the depth direction at a portion located closer to the interphase region 13 than the VB contact region 23, and reaches a p-type region 20a on the substrate rear surface side. The p-type region 20a on the substrate rear surface side is a portion of the p⁻⁻⁻-type semiconductor substrate 20 remaining as a p-type region because the n-type region 21, the n⁻-type region 22, and the p⁻-type region 31 are not formed in a portion deeper than these regions from the front surface of the substrate. The p⁻-type opening 33 may be a portion of the semiconductor substrate 20 remaining in a slit-shape so as to be exposed at the substrate front surface from the n-type region 20a on the substrate rear surface side.

The p⁻-type opening 33 is arranged on a path of an electron current 42 flowing from the interphase region 13 into the high-potential-side region 11 of the one phase (the W-phase) when a negative voltage surge is produced in the VS contact electrode (not depicted) of the high-potential-side region 11 of the other phase (the V-phase). The resistance of the path of the electron current 42 therefore becomes high and, when a negative voltage surge is produced in the VS contact electrode of the high-potential-side region 11 of the other phase, the amount of the electron carriers that flow from the interphase region 13 into the one phase (the amount of current of the electron current) may be reduced. In addition, substrate resistance 43 (the resistance caused by the p-type region 20a on the substrate rear surface side) is high relative to that of the electron carriers. Therefore, the electron carriers that flow into the high-potential-side region 11 of the one phase (the W-phase) taking a path through the p⁻-type region 31 and, the p-type region 20a and the n-type region 21 on the substrate rear surface side, without passing through the p⁻-type opening 33 may be suppressed.

Figure 3A:
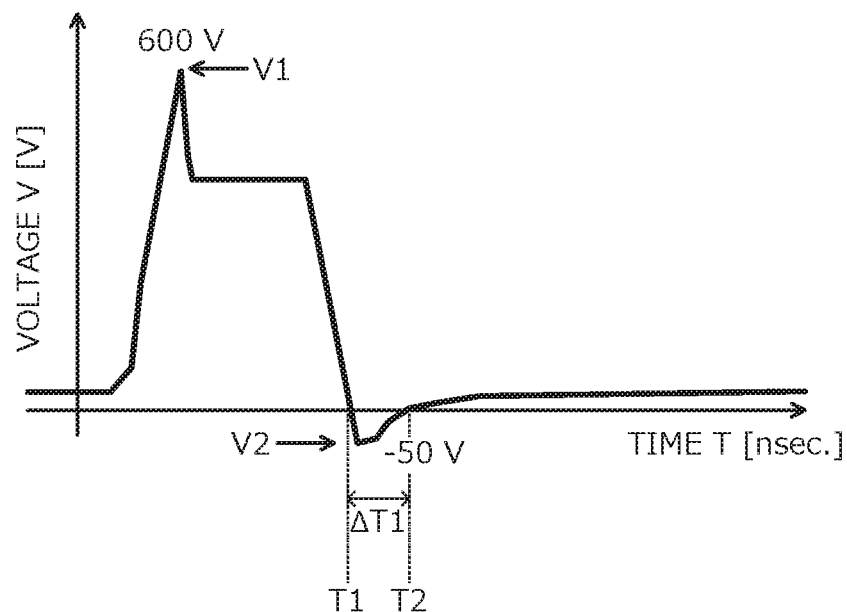
Figure 3B:
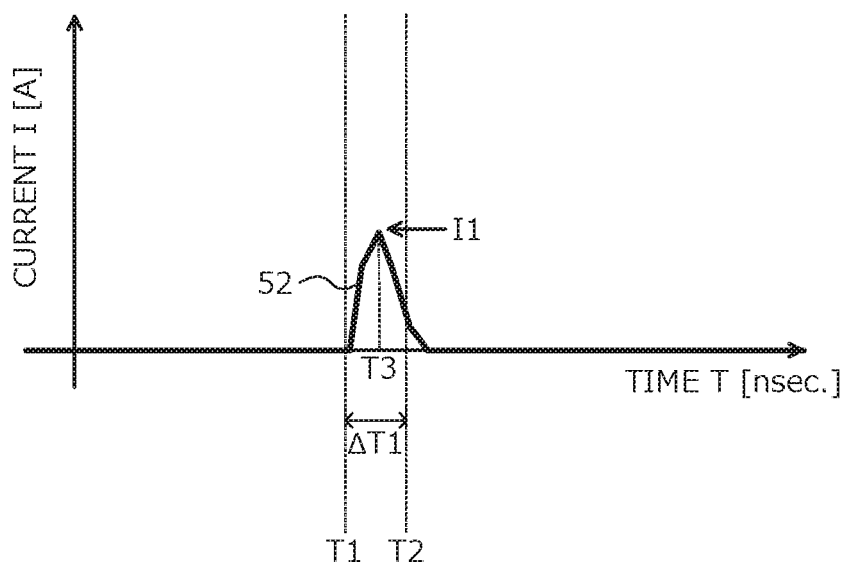
Figure 4:
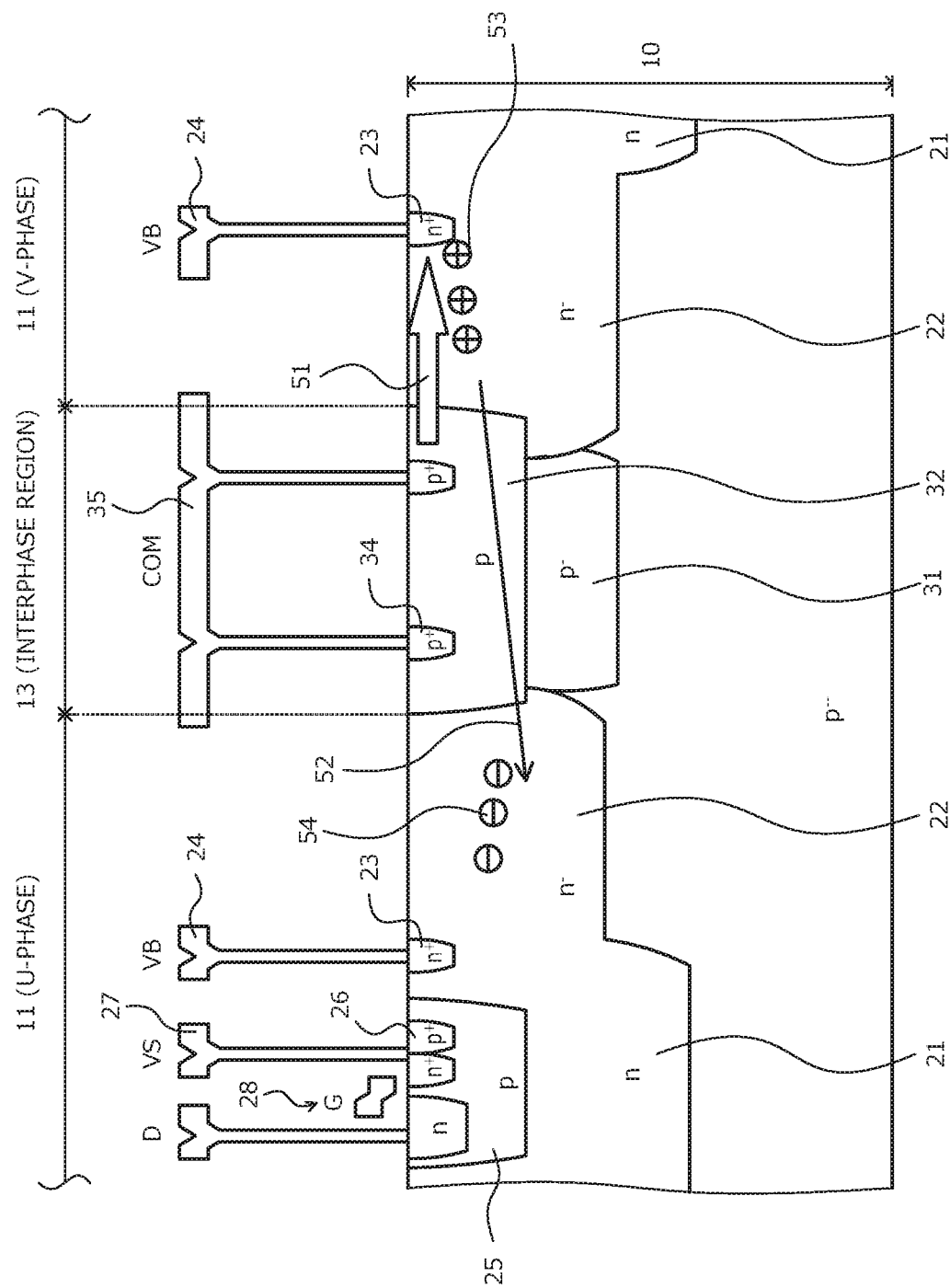
FIG. 4 is a cross-sectional view of a cross-sectional structure of a comparative example.

Verification was executed for the amount of electron carriers that flow from the interphase region 13 into the high-potential-side region 11 of the one phase (the W-phase) when a negative voltage surge is produced in the VS contact electrode of the high-potential-side region 11 of the other phase (the V-phase). FIGS. 3A, 3B, and 3C are timing charts of the relationship between the negative voltage surge and the amount of electron carriers that flow in. FIG. 3A depicts a timing chart of the voltage applied to the VS contact electrode of the high-potential-side region 11 of the V-phase. FIG. 3B depicts a timing chart of the electron current flowing into the high-potential-side region 11 of the U-phase of a comparative example (FIG. 4). FIG. 3C depicts a timing chart of the electron current flowing into the high-potential-side region 11 of the W-phase of a verification example (FIG. 2A). FIG. 4 is a cross-sectional view of a cross-sectional structure of the comparative example.

A semiconductor integrated circuit device according to the first embodiment was produced as the verification example. Another semiconductor integrated circuit device was produced as the comparative example whose interphase region 13 had a GND contact region 34 and a GND contact electrode 35 arranged therein and that did not include a p⁻-type opening, as depicted in FIG. 4. In the comparative example, the GND contact region (a p⁺-type contact region) 34 was selectively provided in the p-type region 32 in the interphase region 13. The GND contact electrode 35 was in contact with the GND contact region 34. The potential COM of the GND contact electrode 35 was the potential of the ground voltage GND. Of the components of the comparative example in FIG. 4, components identical to those of the verification example are given the same reference numerals used in the verification example.

As depicted in FIG. 3A, during normal operation, a voltage V1 of, for example, about 600 V was applied to the VS contact electrode of the high-potential-side region 11 of the V-phase. On the other hand, during an interval ΔT1 during which a negative voltage surge was produced in the VS contact electrode of the high-potential-side region 11 of the V-phase (hereinafter, referred to as "negative voltage surge interval"), the negative voltage surge having a voltage waveform steeply decreasing forming a peak voltage V2 of about −50 V and thereafter steeply increasing was applied to the VS contact electrode of the high-potential-side region 11 of the V-phase.

In the comparative example, the GND contact region 34 and the GND contact electrode 35 of the interphase region 13 acted as the inflow sources of hole carriers 53. Therefore, during the negative voltage surge interval ΔT1 (=T2−T1), a hole current 51 flowing into the high-potential-side region 11 of the V-phase increased and, associated with this, an electron current 52 flowing into the high-potential-side region 11 of the W-phase increased. A reference numeral "54" denotes electron carriers. As depicted in FIG. 3B, the electron current 52 flowing into the high-potential-side region 11 of the W-phase steeply increased associated with the increase of the negative voltage surge from a negative voltage surge application start time T1 to reach a peak value I1 during the negative voltage surge interval ΔT1 and became substantially 0 A at a negative voltage surge application end time T2. Reference T3 is the time when the electron current 52 reaches the peak value I1.

On the other hand, in the verification example, the interphase region 13 had no GND contact region and no GND contact electrode present therein. Therefore, during the negative voltage surge interval ΔT1, a hole current 41 flowing into the high-potential-side region 11 of the V-phase was suppressed and the electron current 42 flowing into the high-potential-side region 11 of the W-phase was thereby suppressed. Therefore, as depicted in FIG. 3C, the electron current 42 flowing into the high-potential-side region 11 of the W-phase moderately increased from the negative voltage surge application start time T1 and reached a peak value I2 at the negative voltage surge application end time T2. The peak value I2 of the electron current 42 in the verification example was small compared to the peak value I1 of the electron current 52 of the comparative example (I2<I1).

In the verification example, the electron carriers remained even after the negative voltage surge application came to an end. Because the electron current 42 also flowed after the negative voltage surge application came to an end, an interval ΔT2 during which the electron current 42 flowed was longer than the negative voltage surge interval T1. The current amount of the electron current 42 (the integral amount) in the verification example however became, for example, about 80% of, for example, the amount of current of the electron current 52 of the comparative example because the electron current 42 flowing into the high-potential-side region 11 of the U-phase was suppressed. In the verification example, the peak value I2 of the electron current 42 was reduced and the electron carriers remaining after the negative voltage surge application came to an end were also reduced by arranging the p⁻-type opening 33 in the path of the electron current 42. Thus, the amount of current of the electron current 42 was further reduced and was able to be reduced to, for example, about ⅓ of the amount of current of the electron current 52 of the comparative example.

As described above, according to the first embodiment, when a negative voltage surge is produced in the VS contact electrode of the high-potential-side region of the one phase, the amount of the hole carriers flowing into the high-potential-side region of the one phase may be reduced by arranging no GND contact region and no GND contact electrode in the interphase region. The amount of electron carriers that flow from the high-potential-side region of the one phase into the high-potential-side region of the other phase may be reduced. According to the first embodiment, the amount of electron carriers that flow may be further reduced by arranging the p⁻-type opening in the path of the current flowing from the high-potential-side region of the one phase into the high-potential-side region of the other phase.

Figure 5:
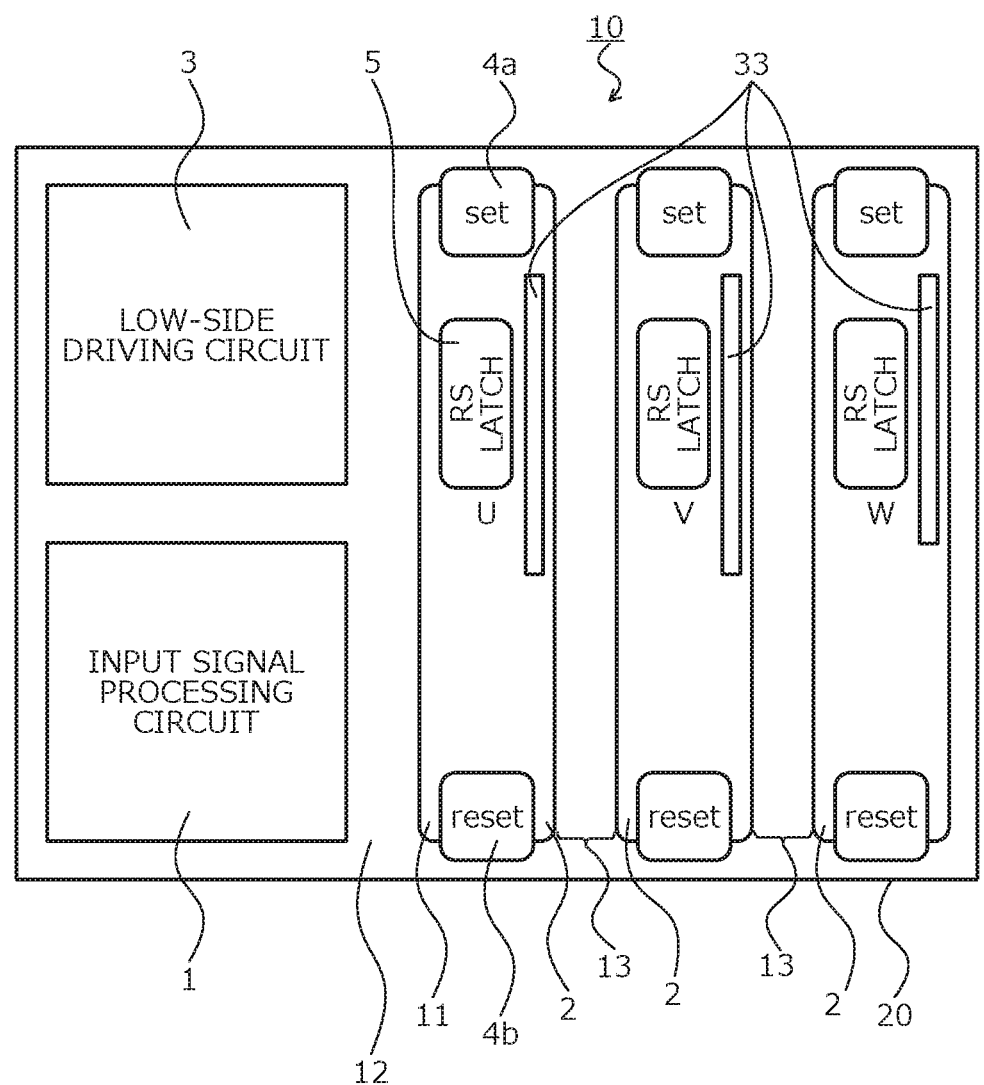
FIG. 5 is a plan diagram of a planar layout of the semiconductor integrated circuit device according to a second embodiment.

A structure of the semiconductor integrated circuit device according to a second embodiment will be described. FIG. 5 is a plan diagram of a planar layout of the semiconductor integrated circuit device according to the second embodiment. The semiconductor device according to the second embodiment is different from the semiconductor device according to the first embodiment in that the high-potential-side region 11 is arranged in a stripe-like planar layout.

As described above, according to the second embodiment, even when the planar layout of the high-potential-side region is variously changed, effects identical to those of the first embodiment may be achieved by arranging no GND contact region and no GND contact electrode in the interphase region. According to the second embodiment, effects identical to those of the first embodiment may be achieved by arranging the p⁻-type opening in the high-potential-side region similar to that of the first embodiment.

Figure 6:
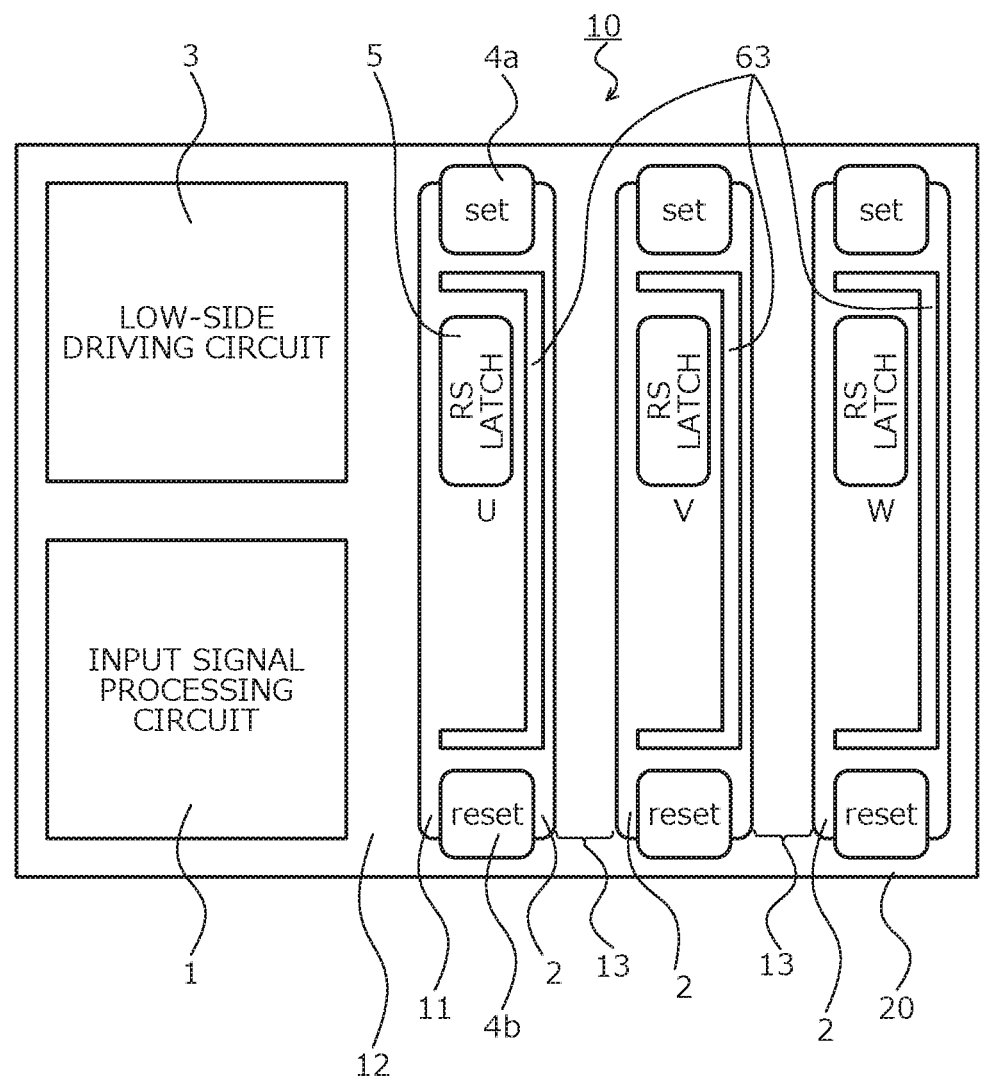
FIG. 6 is a plan diagram of a planar layout of the semiconductor integrated circuit device according to a third embodiment.

A structure of the semiconductor integrated circuit device according to a third embodiment will be described. FIG. 6 is a plan diagram of a planar layout of the semiconductor integrated circuit device according to the third embodiment. The semiconductor device according to the third embodiment is different from the semiconductor device according to the second embodiment in that a p⁻-type opening 63 is arranged between the plural circuit units including the RS latch 5 and the HVNMOSs 4a and 4b of the high-side driving circuit 2 arranged in the high-potential-side region 11 of the one phase.

The p⁻-type opening 63 may have, for example, a concave planar shape that extends, for example, from between the interphase region 13 and, the circuit units and the VB contact region in the high-potential-side region 11 of the one phase, to between the circuit units and the respective HVNMOSs 4a and 4b. The plural circuit units including the RS latch 5 of the high-side driving circuit 2 are, for example, the driver circuit 216; the circuit units 215 such as the logic circuit, the low-pass filter, and the RS latch 5; and the circuit units excluding the HVNMOSs 4a and 4b of the level shift circuit 4.

As described above, according to the third embodiment, the electron carriers are prevented from flowing from the plural circuit units including the RS latch of the high-side driving circuit into the drain of the HVNMOS whereby malfunction of the HVNMOS may be prevented.

In the description, the present invention is not limited to the embodiments and may variously be changed within a scope not departing from the spirit of the present invention. The present invention is further implemented when the conductivity types are reversed.

However, in Japanese Laid-Open Patent Publication Nos. 2010-263116 and 2005-176174, a device such as the clamping high voltage diode or the malfunction detecting circuit HVNMOS needs to be arranged in the HVIC and this leads to an increase of the chip area. For example, because the width of the edge termination region in the HVIC is about 100 μm in the case of a 600-V device, for gate driver ICs driving the three-phase inverter integrated in a single semiconductor substrate (one chip), the increase of the chip area due to the addition of the device becomes about a three-fold. Therefore, a problem arises in that the chip size is significantly increased. Japanese Laid-Open Patent Publication Nos. 2010-263116, 2005-176174, and 2015-173255, and International Publication No. 2016/002508 describe techniques for the driver IC driving a single phase and these techniques do not suppress adverse effects caused by carriers flowing into the phases when a negative voltage surge is produced in the driver IC that drives multiple phases (the U-phase, the V-phase, and the W-phase).

Figure 9:
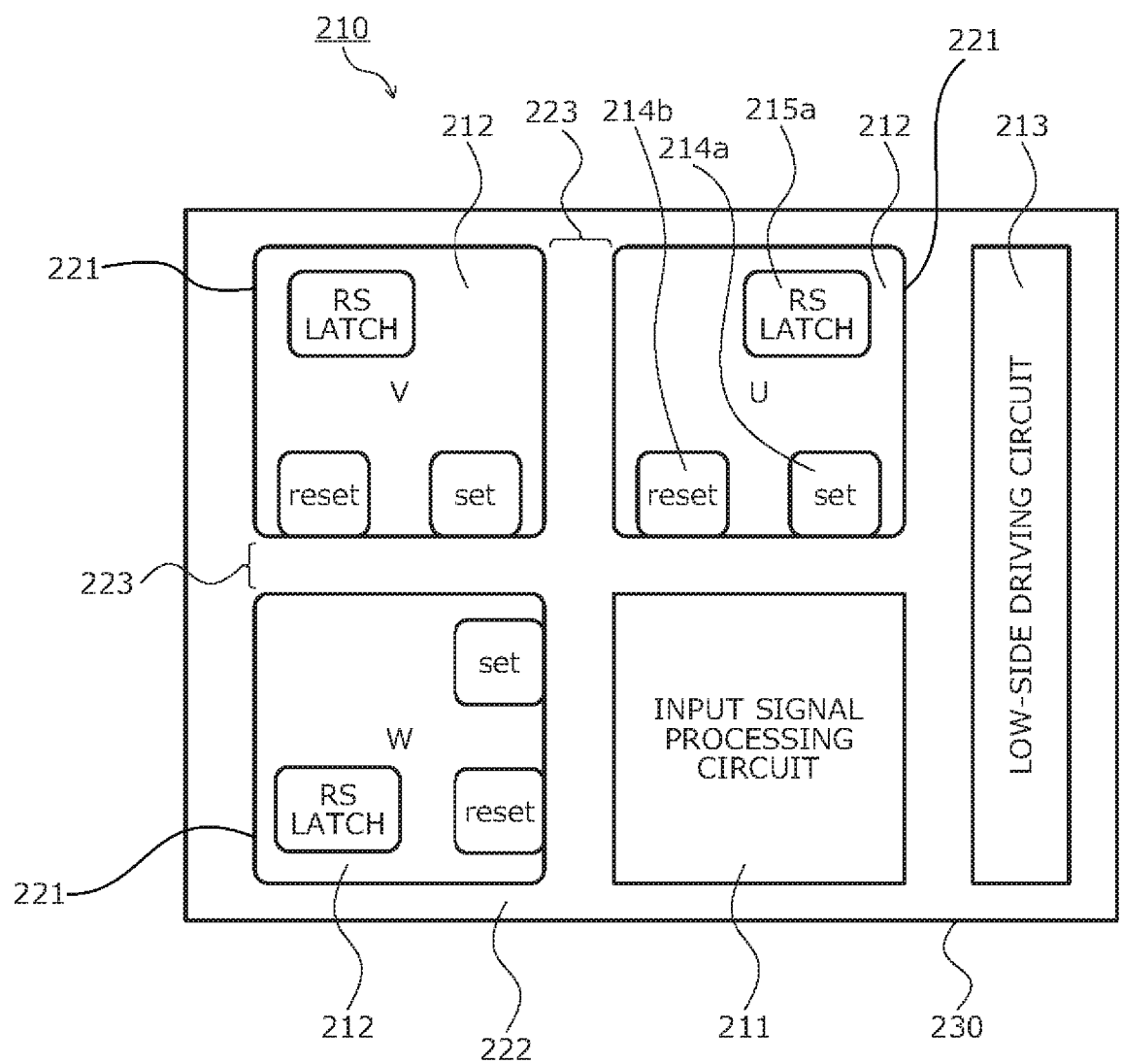
FIGS. 9 and 10 are each a plan diagram of a planar layout of a conventional HVIC.
Figure 10:
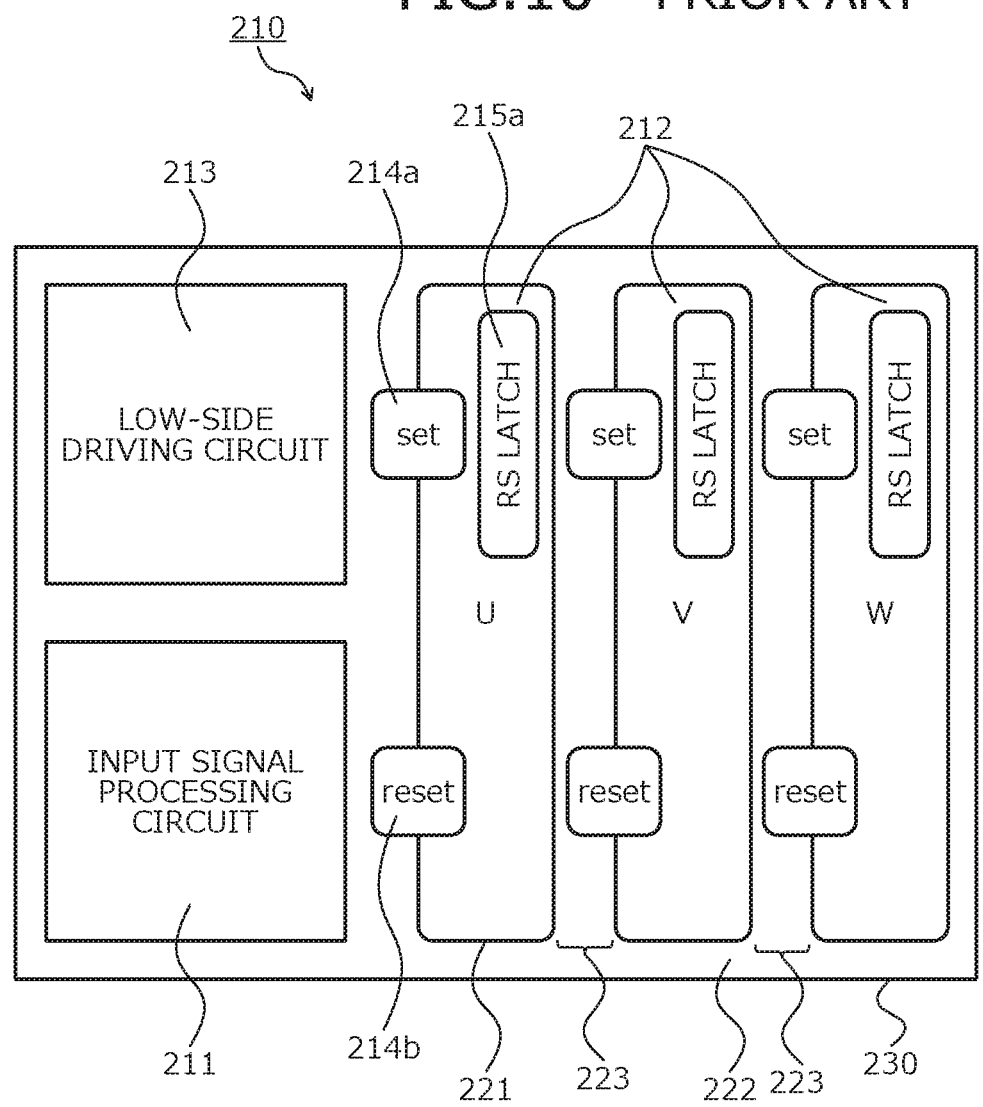

In each of the three-phase inverter HVICs 210 depicted in FIGS. 9 and 10, the HVNMOSs 214a and 214b are arranged in portions facing the interphase region 223. This is to substantially equalize between the two HVNMOSs 214a and 214b, the amount of the electron carriers flowing in from the high-potential-side region 221 of another phase adjacent thereto, when a negative voltage surge is produced in the high-potential-side region 221 of one phase. Malfunction of the "set" and "reset" HVNMOSs 214a and 214b is prevented by reducing the difference between the amounts of the electron carriers flowing into the drains of the HVNMOSs 214a and 214b. A large amount of electron carriers, however, flow into the HVNMOSs 214a and 214b from the high-potential-side region 221 of another phase through the interphase region 223 and increase the possibility of the HVIC 210 malfunctioning because the distance to the adjacent high-potential-side region 221 of the other phase is short.

Figure 11:
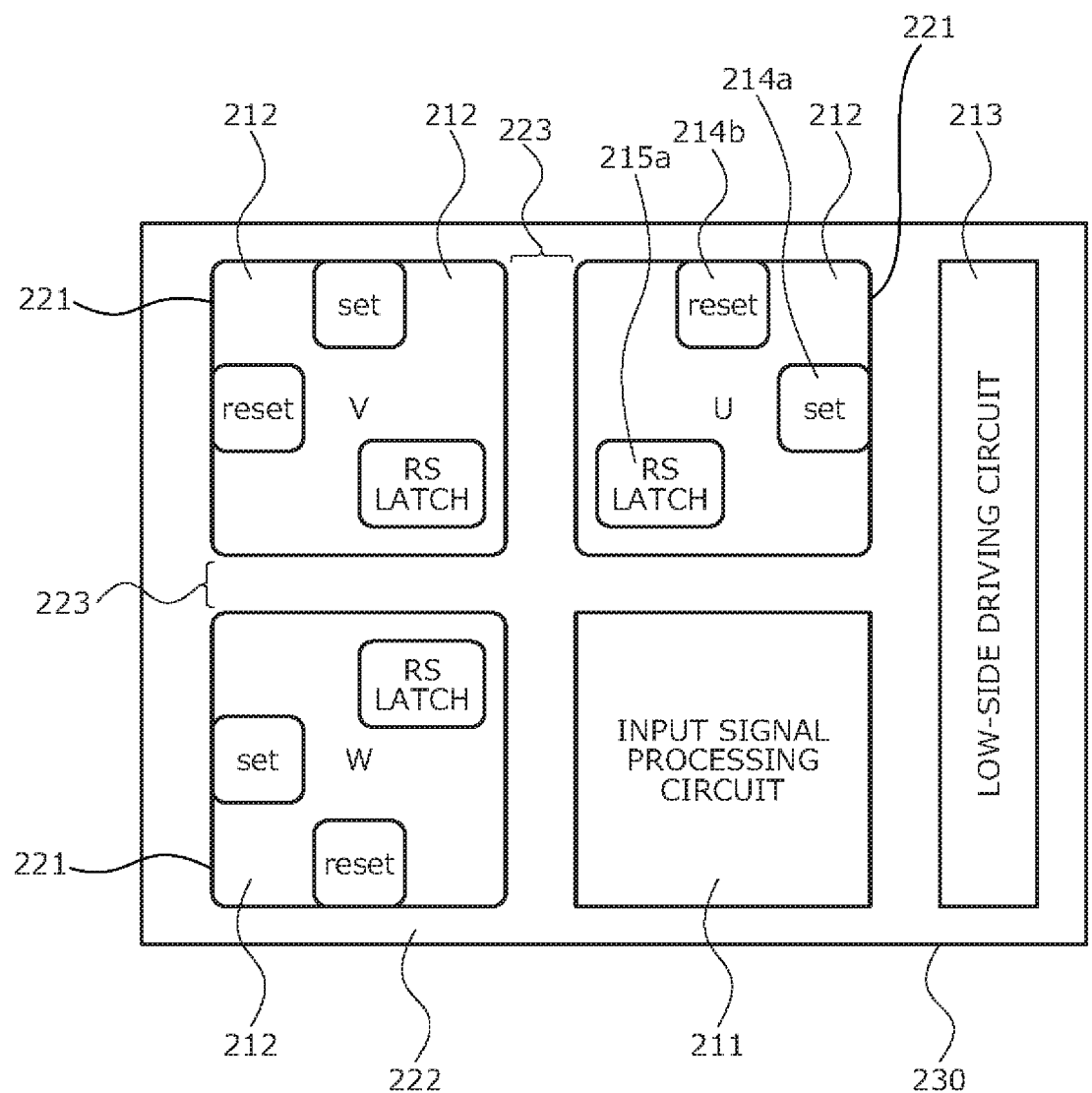
FIGS. 11 and 12 are each a plan diagram of another example of a planar layout of a conventional HVIC.
Figure 12:
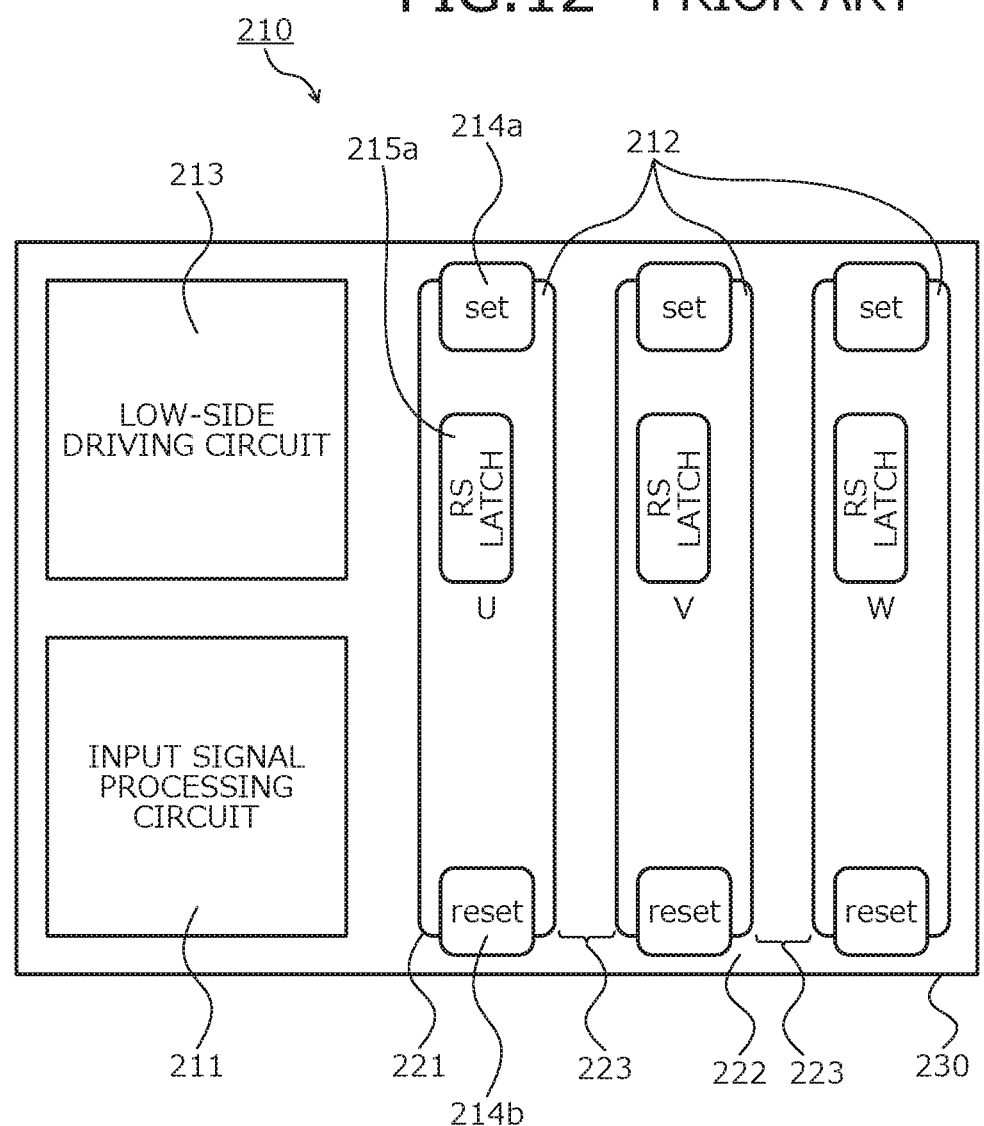

As to the adverse effects in the high-potential-side region 221 of the other phase when a negative voltage surge is produced in the high-potential-side region 221 of one phase, in Japanese Patent No. 5825443, the critical negative voltage surge amount is improved by at least equalizing the amounts of the electron carriers flowing into the drains of both of the HVNMOSs 214a and 214b (see FIGS. 11 and 12). Restrictions, however, arise on the planar layout of the HVNMOSs 214a and 214b and the degree of freedom of the design is lost because the arrangement of the HVNMOSs 214a and 214b is limited to equalizing the amounts of the electron carriers flowing into the drains of both of the HVNMOSs 214a and 214b.

In Japanese Patent No. 5825443, even when the arrangement of the HVNMOSs 214a and 214b is limited, because the injection of the electron carriers into the high-side driving circuit 212 is not suppressed, malfunction of the logic of the high-side driving circuit 212 may be induced similarly to that of the conventional structures depicted in FIGS. 9 and 10. The HVIC 210 may malfunction due to a large amount of electron carriers flowing into the circuit units other than the HVNMOSs 214a and 214b of the level shift circuit 214, the RS latch (the circuit unit 215) that retains a 1-bit set/reset signal input from the level shift circuit 214, the driver circuit 216, and the like, among the circuit units of the high-side driving circuit 212 (see FIG. 8).

According to the semiconductor integrated circuit device of the present invention, when a negative voltage surge is produced in the high-side driving circuit of one phase, the amount of the carriers that flow into the high-potential-side regions of one phase and another phase may be reduced. An effect is thereby achieved in that malfunction of the circuit units of the high-side driving circuits of the one phase and the other phase may be prevented.

As described above, the semiconductor integrated circuit device according to the present invention is useful for a semiconductor integrated circuit device used in a power converting equipment such as an inverter, or power supply devices such as in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor integrated circuit device, comprising:
  a semiconductor substrate;
  a plurality of driving circuits;
  a plurality of high-potential-side regions including a first high-potential-side region and a second high-potential-side region that are adjacent to each other, each high-potential-side region including
    a first semiconductor region of a first conductivity type, selectively provided in a surface layer of the semiconductor substrate,
    a second semiconductor region of a second conductivity type, selectively provided in the first semiconductor region,
    a first electrode electrically connected to the first semiconductor region, and a second electrode electrically connected to the second semiconductor region; and a low-potential-side region provided in a first area other than a second area in which the plurality of high-potential-side regions are disposed, the low-potential-side region including a third semiconductor region of the second conductivity type, provided in an area of the surface layer of the semiconductor substrate other than the first semiconductor region, an interphase region that is an entire area between any two high-potential-side regions that are adjacent to each other, including between the first and second high-potential-side regions, the interphase region including a portion of the third semiconductor region and being free of the first semiconductor region, and a third electrode not overlapping the interphase region in a plan view, the third electrode directly contacting the third semiconductor region, wherein each of the plurality of high-potential-side regions includes a different one of the plurality of driving circuits.

2. The semiconductor integrated circuit device according to claim 1, further comprising a fourth semiconductor region of the second conductivity type, selectively provided in the first semiconductor region in the first high-potential-side region to penetrate the first semiconductor region in a depth direction, and a fifth semiconductor region of the first conductivity type, provided in the first semiconductor region of the first high-potential-side region, having an impurity concentration greater than an impurity concentration of the first semiconductor region, and contacting the first electrode, the fourth semiconductor region being arranged between the interphase region and the fifth semiconductor region.

3. The semiconductor integrated circuit device according to claim 2, further comprising a circuit unit having at least one circuit, arranged in of the second high-potential-side region, wherein the fourth semiconductor region is provided in the first high-potential-side region and is arranged between the fifth semiconductor region in the first high-potential-side region, and the circuit unit in the second high-potential-side region.

4. The semiconductor integrated circuit device according to claim 3, wherein the at least one circuit included in the circuit unit is a logic circuit retaining 1-bit information.

5. The semiconductor integrated circuit device according to claim 1, further comprising:

a fourth semiconductor region of the second conductivity type, selectively provided in the first semiconductor region in the first high-potential-side region to penetrate the first semiconductor region in a depth direction; and a circuit unit having at least one circuit arranged in the first semiconductor region in the first high-potential-side region, the fourth semiconductor region being arranged between the circuit unit and the interphase region.

6. The semiconductor integrated circuit device according to claim 5, wherein the circuit unit includes a first circuit unit having at least one circuit arranged in the first semiconductor region in the first high-potential-side region, and a second circuit unit having at least one circuit arranged in the first semiconductor region in the second high-potential-side region.

7. The semiconductor integrated circuit device according to claim 5, wherein the at least one circuit included in each of the first and second circuit units is a logic circuit retaining 1-bit information.

8. The semiconductor integrated circuit device according to claim 1, wherein the third semiconductor region includes a contact region of the second conductivity type, contacting the third electrode.

9. The semiconductor integrated circuit device according to claim 1, wherein each of the first and second high-potential-side regions has a substantially rectangular shape with four sides in the plan view, and the interphase region is disposed along one side of the four sides of the first high-potential-side region, the one side of the four sides of the first high-potential-side region being parallel to and facing one side of the four sides of the second high-potential-side region.

10. The semiconductor integrated circuit device according to claim 1, wherein the semiconductor integrated circuit device is a device for driving a plurality of switching elements that are different from each other, and each of the plurality of driving circuits is a circuit for driving a corresponding one of the plurality of switching elements.

11. A semiconductor integrated circuit device, comprising:

a semiconductor substrate; a plurality of high-potential-side regions including a first high-potential-side region and a second high-potential-side region that are adjacent to each other, each high-potential-side region including a first semiconductor region of a first conductivity type, selectively provided in a surface layer of the semiconductor substrate, a second semiconductor region of a second conductivity type, selectively provided in the first semiconductor region, a first electrode electrically connected to the first semiconductor region, and a second electrode electrically connected to the second semiconductor region; and a low-potential-side region provided in a first area other than a second area in which the plurality of high-potential-side regions are disposed, the low-potential-side region including a third semiconductor region of the second conductivity type, provided in an area of the surface layer of the semiconductor substrate other than the first semiconductor region, an interphase region that is an entire area between any two high-potential-side regions that are adjacent to each other, including between the first and second high-potential-side regions, the interphase region including a portion of the third semiconductor region and being free of the first semiconductor region, and a third electrode not overlapping the interphase region in a plan view, the third electrode directly contacting the third semiconductor region.

12. The semiconductor integrated circuit device according to claim 11, wherein the semiconductor integrated circuit device is a device for driving a plurality of switching elements that are different from each other, and the semiconductor integrated circuit device further comprises a plurality of driving circuits that are different from each other.

13. A semiconductor integrated circuit device, comprising:
- a semiconductor substrate;
- a plurality of high-potential-side regions including a first high-potential-side region and a second high-potential-side region that are adjacent to each other, each high-potential-side region including
  - a first semiconductor region of a first conductivity type, selectively provided in a surface layer of the semiconductor substrate,
  - a second semiconductor region of a second conductivity type, selectively provided in the first semiconductor region,
  - a first electrode electrically connected to the first semiconductor region, and
  - a second electrode electrically connected to the second semiconductor region; and
- a low-potential-side region provided in a first area other than a second area in which the plurality of high-potential-side regions are disposed, the low-potential-side region including
  - a third semiconductor region of the second conductivity type, provided in an area of the surface layer of the semiconductor substrate other than the first semiconductor region,
  - an interphase region that is an entire area between any two high-potential-side regions that are adjacent to each other, including between the first and second high-potential-side regions, the interphase region including a portion of the third semiconductor region and being free of the first semiconductor region, and
  - a third electrode not overlapping the interphase region in a plan view, the third electrode directly contacting the third semiconductor region, wherein
- the first and second high-potential-side regions directly contact and are aligned with the interphase region disposed therebetween in one direction in the plan view.

14. The semiconductor integrated circuit device according to claim 13, wherein the semiconductor integrated circuit device is a device for driving a plurality of switching elements that are different from each other, and the semiconductor integrated circuit device further comprises a plurality of driving circuits that are different from each other, wherein
- each of the plurality of high-potential-side regions includes one of the plurality of driving circuits, each of the plurality of driving circuits being a circuit for driving a corresponding one of the plurality of switching elements.

* * * * *